(12) United States Patent
Ryu

(10) Patent No.: US 7,829,370 B2
(45) Date of Patent: Nov. 9, 2010

(54) IMAGE SENSOR AND FABRICATING METHOD THEREOF

(75) Inventor: Sang-Wook Ryu, Chungcheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 323 days.

(21) Appl. No.: 11/933,811

(22) Filed: Nov. 1, 2007

(65) Prior Publication Data
US 2008/0135962 A1 Jun. 12, 2008

(30) Foreign Application Priority Data
Dec. 12, 2006 (KR) ............... 10-2006-0126105

(51) Int. Cl.
*H01L 21/00* (2006.01)
(52) U.S. Cl. ............... 438/70; 438/57; 438/69; 257/E21.001
(58) Field of Classification Search ............... 438/70, 438/71, 78, 69; 257/432, E31.127
See application file for complete search history.

(56) References Cited

U.S. PATENT DOCUMENTS

| 5,796,154 | A | * | 8/1998 | Sano et al. | ............ 257/432 |
|---|---|---|---|---|---|
| 7,253,399 | B2 | * | 8/2007 | Sakoh et al. | ............ 250/239 |
| 7,683,388 | B2 | * | 3/2010 | Mori | ............ 257/89 |
| 2001/0033007 | A1 | * | 10/2001 | Lee | ............ 257/432 |
| 2005/0045805 | A1 | | 3/2005 | Sakoh et al. | |
| 2005/0101049 | A1 | * | 5/2005 | Kim | ............ 438/66 |
| 2005/0194611 | A1 | * | 9/2005 | Jeong | ............ 257/146 |
| 2005/0280108 | A1 | | 12/2005 | Kim | |
| 2006/0044449 | A1 | * | 3/2006 | Sakoh | ............ 348/336 |
| 2006/0049476 | A1 | * | 3/2006 | Koizumi et al. | ............ 257/432 |
| 2006/0054946 | A1 | * | 3/2006 | Baek et al. | ............ 257/292 |
| 2007/0158772 | A1 | * | 7/2007 | Boettiger | ............ 257/432 |

FOREIGN PATENT DOCUMENTS

| CN | 1591886 | 3/2005 |
|---|---|---|
| KR | 1020060011411 | 2/2006 |

* cited by examiner

*Primary Examiner*—Charles D Garber
*Assistant Examiner*—Angel Roman
(74) *Attorney, Agent, or Firm*—Sherr & Vaughn, PLLC

(57) ABSTRACT

An image sensor and fabricating method thereof which reduces a light intensity differential between a pixel center and a pixel edge and prevents crosstalk. The image sensor can include a plurality of convex lens provided within a passivation layer and in vertical alignment with a corresponding photodiode, each convex lens including a color filter; having a predetermined color array, and a plurality of microlens provided over the passivation layer and in vertical alignment with a corresponding color filer.

16 Claims, 5 Drawing Sheets

IMAGE SENSOR AND FABRICATING METHOD THEREOF

The present application claims 35 U.S.C. 119 to Korean Patent Application No. 10-2006-0126105 (filed on Dec. 12, 2006), which is hereby incorporated by reference in its entirety.

BACKGROUND

An image sensor is a semiconductor device used to convert optical images detected by the image sensor to electric signals. Image sensors may be classified as a charge coupled device (CCD) or a complementary metal oxide semiconductor (CMOS).

A CCD image sensor is provided with metal oxide silicon (MOS) capacitors that are spatially positioned within close proximity to each other and charge carriers are stored in and transferred to the capacitors.

A CMOS image sensor may be provided with a plurality of MOS transistors corresponding to pixels of a semiconductor device having a control circuit and a signal processing circuit as peripheral circuits. The control circuit and the signal processing unit may be integrated together to employ a switching method that detects output through the MOS transistors. In a CMOS image sensor, as light intensity of the photodiode increases, photosensitivity of the image sensor may be further enhanced.

The CCD image sensor is considered superior to the CMOS image sensor in terms of photosensitivity and noise reduction but has difficulty in achieving highly integrated density and low power consumption. Moreover, the CMOS image sensor is simpler to manufacture and can be more suitable for achieving highly integrated density and low power consumption. Accordingly, aspects of semiconductor fabricating technology have focused on developing a CMOS image sensor due to its qualities in addition to enhanced fabricating technology.

In order to raise photosensitivity in image sensors such as CMOS image sensors, a fill factor, which indicates a ratio of a photodiode size to a total size of an image sensor, may be increased or a microlens is provided in order to condense light into the photodiode by changing a path of light incident on an area except the photodiode.

Figure 1:
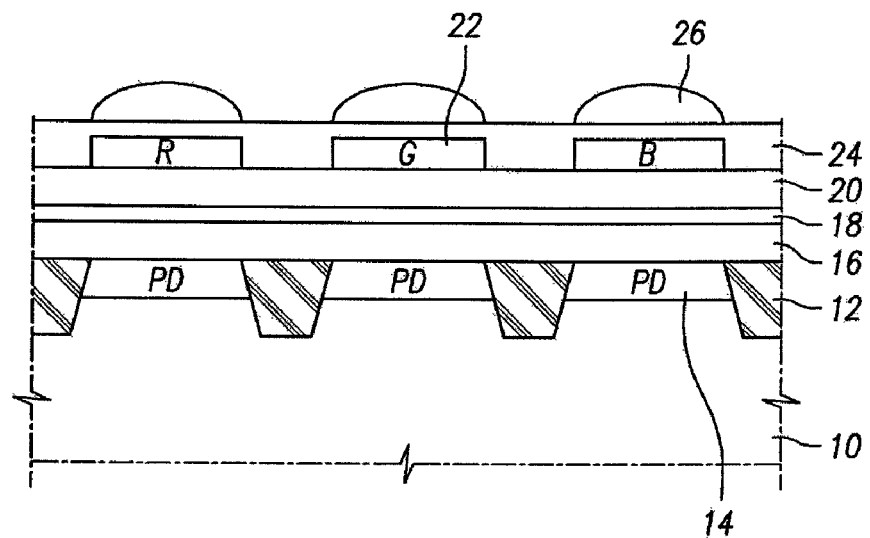

As illustrated in example FIG. 1, an image sensor may include device isolation layer 12 formed on and/or over semiconductor substrate 10. Device isolation layer 12 may define an active area of semiconductor substrate 10.

A plurality of photodiodes 14 may be provided on and/or over semiconductor substrate 10. Photodiodes 14 may be formed in an active area of semiconductor substrate 10 in order to generate charges according to the intensity of incident light.

Insulating interlayer 16 and insulating layer 18 may be formed on and/or over semiconductor substrate 10 including device isolation layer 12 and photodiodes 14. Insulating interlayer 16 can be formed to cover photodiodes 14 while insulating layer 18 can be formed on and/or over insulating interlayer 16. Passivation layer 20 may be formed on and/or over semiconductor substrate 10 including insulating layer 18.

A plurality of color filters 22 may be formed on and/or over semiconductor substrate 10. Color filters 22 may include color filters composed of red R, green G and blue B. Planarization layer 24 may be formed on and/or over semiconductor substrate 10 including passivation layer 20 and color filters 22. Planarization layer 24 may serve to planarize the surface of color filter 22.

A plurality of microlens 26 may then be provided on and/or over semiconductor substrate 10 including color filter 22 and planarization layer 24. Each microlens 26 can be formed on and/or over planarization layer 24 to oppose a corresponding color filter 22 and condenses light into the corresponding photodiode 14. Each microlens 26 can also be fabricated to have a convex figure with a predetermined curvature in order to externally condense incident light to color filters 22. Color filters 22 may then transmit specific wavelengths of red R, green G and blue B of the projected light to implement colors. Photodiodes 14 may then convert energy of the transmitted light into electric energy.

A packaging process may be conducted on the image sensor. As illustrated in example FIG. 2, external lens 30 can then be attached over the image sensor. The incident light from external lens 30 normally forms an image on a center of the image sensor. Yet, since intensity of light incident on photodiodes 14 becomes reduced toward edges A and B of the image sensor, it is difficult to form a normal image. Accordingly, if intensity of light incident on a unit pixel varies according to the center or edge of the image sensor, the number of electrons generated from photodiode 14 may also vary.

Although an original image has the same color, an image color at the center of the image sensor may be displayed differently from that at the edge of the image sensor. Moreover, crosstalk, i.e., the optical interference between pixels on the edge of the image sensor, may occur to significantly degrade reliability of the image sensor.

SUMMARY

Embodiments relate to an image sensor and fabricating method thereof which reduces a light intensity differential between a pixel center and a pixel edge and prevents undesirable crosstalk.

Embodiments relate to a method of fabricating an image sensor that may include the following steps: providing a semiconductor substrate; forming a plurality of device isolation layers spaced apart over the semiconductor substrate; forming a plurality of photodiodes in spaces between adjacent device isolation layers; forming an insulating interlayer over the semiconductor substrate; forming an insulating layer over the semiconductor substrate including the insulating interlayer; forming a passivation layer over the semiconductor substrate including the insulating layer; forming in the passivation layer a plurality of convex lens in vertical alignment with a corresponding photodiode, wherein each convex lens includes a color filter; and then providing over the passivation layer a plurality of microlens in vertical alignment with a corresponding color filter.

Embodiments relate to an image sensor that may include a plurality of device isolation layers provided over a semiconductor substrate; an insulating interlayer formed over the semiconductor substrate including the photodiodes and the device isolation layers; an insulating layer formed over the semiconductor substrate including the insulating interlayer; a passivation layer formed over the semiconductor substrate including the insulating layer; a plurality of convex lens provided within the passivation layer and in vertical alignment with a corresponding photodiode, wherein each convex lens includes a color filter; and a plurality of microlens provided over the passivation layer and in vertical alignment with a corresponding color filer.

DRAWINGS

Figure 2:
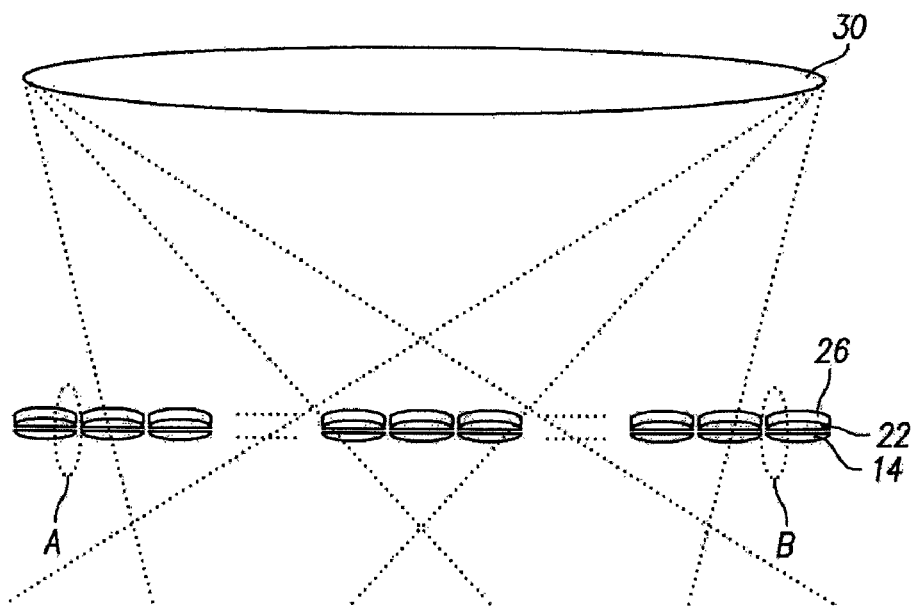

Example FIGS. 1 and 2 illustrate an image sensor and a light path between an image sensor and an external lens.

Example FIGS. 3 to 6 illustrate an image sensor, in accordance with embodiments.

DESCRIPTION

Figure 3:
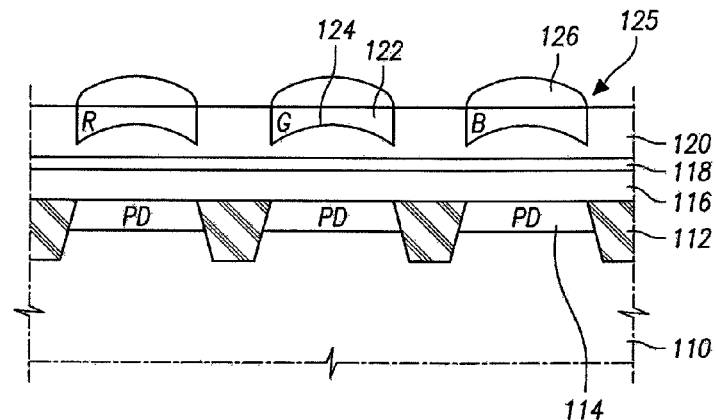

As illustrated in example FIG. 3, image sensor in accordance with embodiments can include a plurality of device isolation layers 112 provided on and/or over semiconductor substrate 110. Device isolation layers 112 can define an active area of semiconductor substrate 110. A plurality of photodiodes 114 may be provided in gaps or spaces between adjacent device isolation layers 112. Photodiodes 114 can be formed in the active area of semiconductor substrate 110 to generate charges according to intensity of incident light.

Insulating interlayer 116 and insulating layer 118 can be formed on and/or over semiconductor substrate 110. Insulating interlayer 116 can be formed to cover photodiodes 114 and insulating layer 118 can be formed on and/or over insulating interlayer 116. Passivation layer 120 can be formed on and/or over insulating layer 118. A plurality of recesses 125 including convex lens 124 can be formed within passivation layer 120 using a dry etch process. Each recess 125 formed within passivation layer 120 can be filled with color filter 122. Color filter 122 may include color filters composed of red R, green G and blue B. Microlens 126 can be formed on and/or over a corresponding color filter 122 to condense light to a corresponding photodiode 114.

Microlens 126 can be fabricated to have a substantially convex configuration having a predetermined curvature. Microlens 126 can serve to condense incident light from an external lens to enable the condensed light to propagate to a corresponding color filter 122.

Figure 4A:
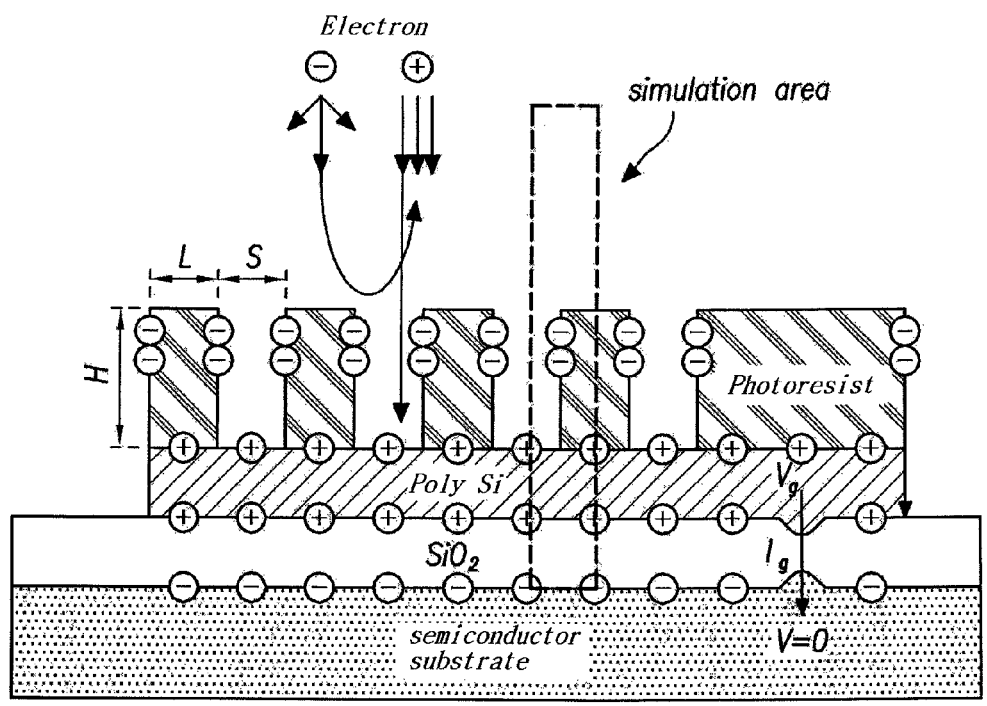
Figure 4B:

As illustrated in example FIG. 4A, passivation layer 120, using an electro-shading effect, can increase an etch speed of an edge part in a region corresponding to microlens 126. Thus, each recess 125 including convex lens 124 can be formed on and/or over passivation layer 120. In an electroshading effect, electrons can be induced along a sidewall of an etched face and a sidewall of a photoresist. Accordingly, as illustrated in example FIG. 4B, an etch rate at an edge of a specific pattern can be higher than that at the center, whereby a figure of the pattern becomes convex.

Convex lens 124 can condense light formed on a region opposing microlens 126. Convex lens 124 can condense incident light to enable the condensed light to propagate to a corresponding photodiode 114. Convex lens 124 can be formed on and/or over an edge area of the image sensor, and more particularly, on a ¼ area from both edges of an entire area. Convex lens 124 is capable of increasing light intensity of pixels provided to the edge area of the image sensor. Accordingly, the pixel light intensity differential between the center and edge of the image sensor can be reduced. Moreover, since light in the pixel at the edge of the image sensor can be condensed, crosstalk can be prevented to enhance reliability of the image sensor.

Color filter 122 can transmit specific wavelengths of red R, green G and blue B of the light projected from microlens 126 to implement colors. Color filter 122 can be provided within recess 125 of passivation layer 120 having convex lens 124. If color filter 122 is provided within recess 125, it may be unnecessary to form a planarization layer to planarize color filter 122.

Figure 5:
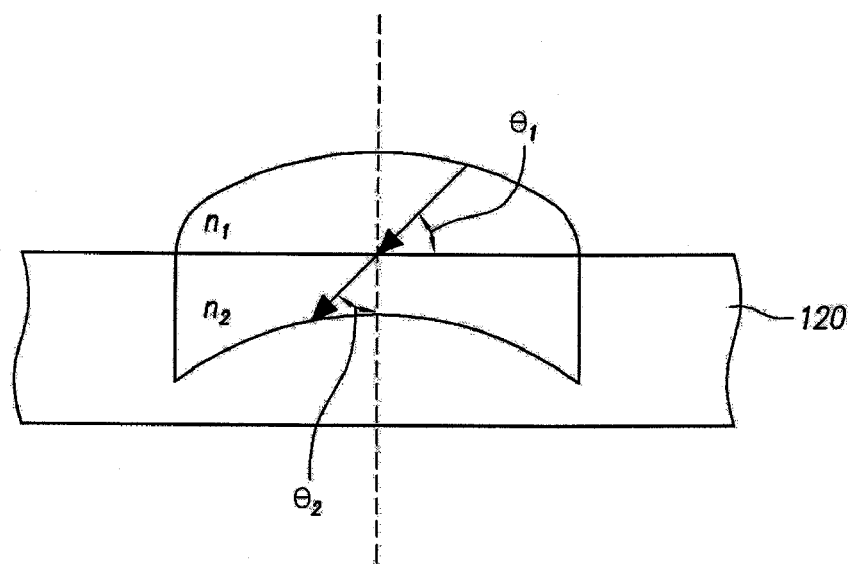

As illustrated in example FIG. 5, refractive index $n_1$ of color filter 122 can be lower than refractive index $n_2$ of passivation layer 120. Refractive index $n_2$ of passivation layer 120 can be between approximately 1.4 to 4.0 while refractive index $n_1$ of color filter 122 can be between approximately 1.2 to 3.0. Refractive index $n_2$ of passivation layer 120 can be about 2.0 and refractive index $n_1$ of color filter 122 can be about 1.6.

According to Snell's law, when light proceeds to a medium having a relatively large refractive index from a medium having a relatively small refractive index, an incidence angle of light becomes smaller than a refraction angle. In particular, according to Snell's law, if light proceeds from color filter 122 having a small refractive index to passivation layer 120 having a large refractive index, and in which convex lens 124 is formed, refraction angle $\theta_2$ of light becomes smaller than incidence angle $\theta_1$. Thus, the incident light from microlens 126 can be made to proceed to photodiodes 114, which can then convert energy of the transmitted light to electric energy.

Figure 6A:
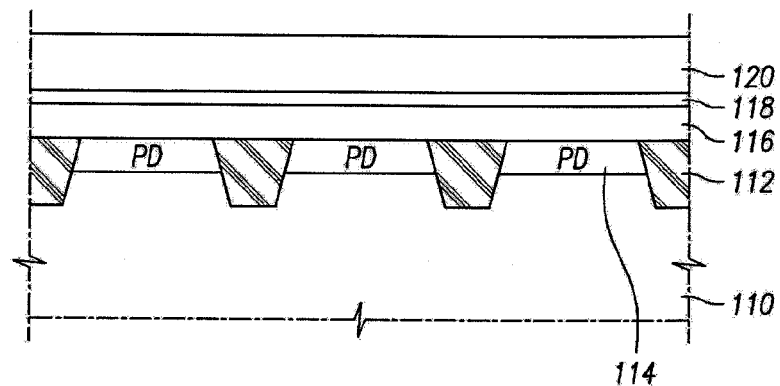

As illustrated in example FIG. 6A, in accordance with embodiments, a method of fabricating an image sensor can include forming insulating interlayer 116 on and/or over semiconductor substrate 110 provided with a plurality of photodiodes 114. Insulating layer 118 can be deposited on and/or over insulating interlayer 116. Insulating layer 118 may be composed of an oxide layer such as plasma enhanced TEOS (PE-TEOS).

Passivation layer 120 can then be formed on and/or over insulating layer 118. Passivation layer 120 can be composed of a nitride layer such as plasma enhanced nitride (PE-nitride). Passivation layer 120 including insulating layer 118 can have a thickness in a range of approximately 500 to 10,000 Å.

Figure 6B:
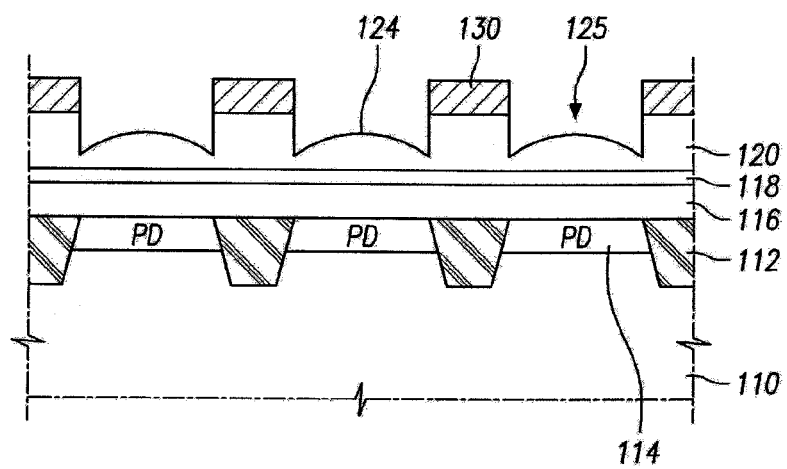

As illustrated in example FIG. 6B, convex lens 124 can be formed within passivation layer 120. Particularly, photoresist pattern 130 can be formed on and/or over passivation layer 120 using a photolithographic process. Photoresist pattern 130 can be formed on and/or over a region where convex lens 124 is not formed. Subsequently, recess 125 including convex lens 124 is formed within passivation layer 120 by performing a dry etch process. The dry etching may be performed using an inert gas such as Ar, He, $O_2$ and $N_2$ gas. For the dry etch, $C_xH_yF_z$ (x,y,z: 0 and natural number) can be used as an etchant. The etched depth can be set to between approximately 500 to 20,000 Å. Photoresist pattern 130 can then be removed using an ashing process.

While performing the dry etch on passivation layer 120, insulating layer 118 can be simultaneously etched. Alternatively, both insulating layer 118 and insulating interlayer 116 can be etched separately. The etched depth can range from between approximately 500 to 20,000 Å.

Figure 6C:
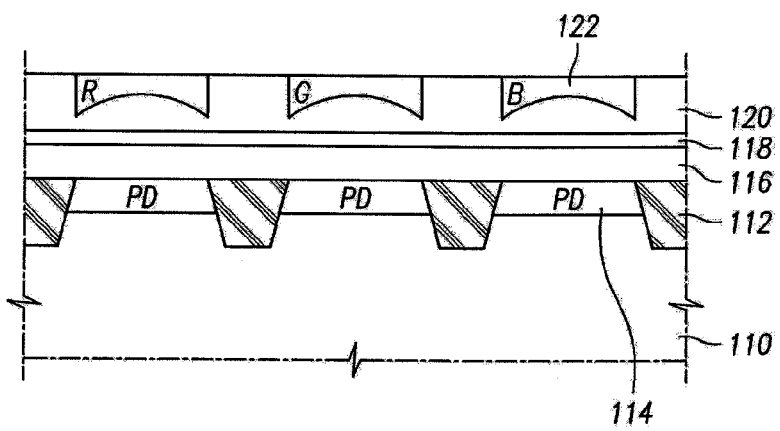

As illustrated in example FIG. 6C, color filter 122 may have a predetermined array of red (R), green (G) and blue (B) formed within recess 125 of passivation layer 120.

Figure 6D:
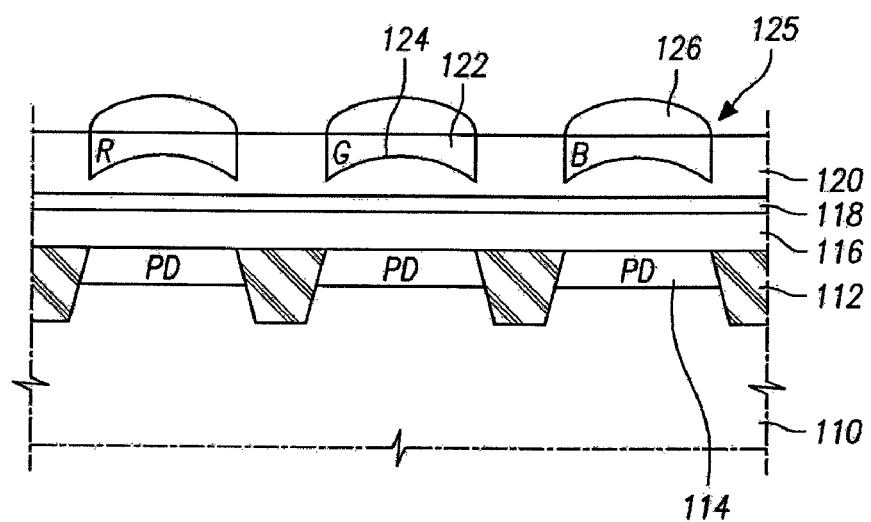

As illustrated in example FIG. 6D, a photoresist pattern can be formed on and/or over a portion of passivation layer 120 including color filters 122, and which only opposes color filters 122. Microlens 126 having a substantially convex shape can be formed by performing reflowing on the photoresist pattern at a temperature of between approximately 150 to 200° C.

Subsequently, a dielectric layer can be formed on and/or over microlens 126 to protect a top surface thereof. The dielectric layer can be formed using a low temperature oxide (LTO) process at a temperature of between approximately 100 to 450° C. The dielectric layer may be formed using the LTO process at 300° C. or below.

The image sensor in accordance with embodiments may include a convex lens provided within a passivation layer, thereby reducing a light intensity differential between a pixel center and a pixel edge of the image sensor. The image sensor in accordance with embodiments can prevent crosstalk by condensing light at an edge thereof, thereby enhancing reliability.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    providing a semiconductor substrate
    forming a plurality of device isolation layers spaced apart over the semiconductor substrate;
    forming a plurality of photodiodes in spaces between adjacent device isolation layers;
    forming an insulating interlayer over the semiconductor substrate;
    forming an insulating layer over the semiconductor substrate including the insulating interlayer;
    forming a passivation layer over the semiconductor substrate including the insulating layer;
    forming in the passivation layer a plurality of convex lenses in vertical alignment with a corresponding photodiode;
    forming a color filter formed on and directly contacting a corresponding one of the convex lenses; and then
    providing over the passivation layer a plurality of microlens in vertical alignment with a corresponding color filter.
2. The method of claim 1, wherein the insulating layer comprises an oxide layer.
3. The method of claim 2, wherein the oxide layer comprises plasma enhanced TEOS.
4. The method of claim 1, wherein the passivation layer comprises a nitride layer.
5. The method of claim 1, wherein the nitride layer comprises plasma enhanced nitride.
6. The method of claim 1, wherein forming the convex lens comprises:
    forming a plurality of photoresist patterns using a photolithographic process over regions of the passivation layer that are not in vertical alignment with a photodiode;
    forming a plurality of recesses within the passivation layer using a dry etch process; and then
    removing the photoresist patterns using an ashing process.
7. The method of claim 6, wherein the dry etching is performed using an inert gas.
8. The method of claim 7, wherein the inert gas is one selected from the group consisting of Ar, He, $O_2$ and $N_2$.
9. The method of claim 6, wherein the etched depth between approximately 500 to 20,000 Å.
10. The method of claim 1, wherein the photodiodes are formed in an active region of the semiconductor substrate to generate charges according to an intensity of incident light.
11. The method of claim 1, wherein a refractive index of the color filters is lower than a refractive index of the passivation layer.
12. The method of claim 11, wherein the refractive index of the passivation layer is between approximately 1.4 to 4.0 and the refractive index of the color filters is between approximately 1.2 to 3.0.
13. The method of claim 12, wherein the refractive index of the passivation layer is about 2.0 and the refractive index of the color filters is about 1.6.
14. The method of claim 1, further comprising forming a dielectric layer over the uppermost surface of a corresponding microlens.
15. A method comprising:
    providing a semiconductor substrate
    forming a plurality of device isolation layers spaced apart over the semiconductor substrate;
    forming a plurality of photodiodes in spaces between adjacent device isolation layers;
    forming an insulating interlayer over the semiconductor substrate;
    forming an insulating layer over the semiconductor substrate including the insulating interlayer;
    forming a passivation layer over the semiconductor substrate including the insulating layer;
    forming a plurality of recesses within the passivation layer in vertical alignment with a corresponding photodiode, wherein each the plurality of recesses includes a convex lens at a bottom surface of each the plurality of recesses;
    forming a color filter on and contacting the convex lens within each the plurality of recesses; and then
    forming a microlens on and contacting a corresponding color filter.
16. The method of claim 15, wherein an upper most surface of the color filter is coplanar with an upper most surface of the passivation layer.

* * * * *